(12) United States Patent
Lang et al.

(10) Patent No.: US 9,831,364 B2
(45) Date of Patent: Nov. 28, 2017

(54) PROCESS FOR PRODUCING HOLLOW SILICON BODIES

(71) Applicants: Juergen Erwin Lang, Karlsruhe (DE); Hartwig Rauleder, Rheinfelden (DE); Julia Lyubina, Hanau (DE); Janaina Marinas Pérez, Murg (DE)

(72) Inventors: Juergen Erwin Lang, Karlsruhe (DE); Hartwig Rauleder, Rheinfelden (DE); Julia Lyubina, Hanau (DE); Janaina Marinas Pérez, Murg (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 14/950,787

(22) Filed: Nov. 24, 2015

(65) Prior Publication Data

US 2016/0155871 A1 Jun. 2, 2016

(30) Foreign Application Priority Data

Nov. 28, 2014 (EP) .................... 14195300

(51) Int. Cl.
*H01L 31/0352* (2006.01)
*H01M 4/38* (2006.01)
*C01B 33/029* (2006.01)
*H01L 31/028* (2006.01)
(Continued)

(52) U.S. Cl.
CPC .... *H01L 31/035281* (2013.01); *C01B 33/027* (2013.01); *C01B 33/029* (2013.01); *C01B 33/03* (2013.01); *H01L 31/0284* (2013.01); *H01M 4/386* (2013.01); *C01P 2004/04* (2013.01); *C01P 2004/34* (2013.01); *C01P 2004/64* (2013.01)

(58) Field of Classification Search
None
See application file for complete search history.

(56) References Cited

U.S. PATENT DOCUMENTS

| 9,120,673 | B2 | 9/2015 | Hoppe et al. |
| 2004/0229447 | A1 | 11/2004 | Swihart et al. |
| 2011/0262339 | A1 | 10/2011 | Rauleder et al. |
| (Continued) | | | |

OTHER PUBLICATIONS

Combined Taiwanese Office Action and Search Report dated Nov. 1, 2016 in Patent Application No. 104139194 (with English translation and English translation of categories of cited documents).
Search Report dated Jun. 10, 2015 in European Patent Application No. 14195300.0.

(Continued)

*Primary Examiner* — Kishor Mayekar
(74) *Attorney, Agent, or Firm* — Oblon, McClelland, Maier & Neustadt, L.L.P.

(57) ABSTRACT

Hollow bodies having a silicon-comprising shell, are produced by, in a gas comprising at least one silane of the general formula $Si_nH_{2n+2-m}X_m$ with n=1 to 4, m=0 to 2n+2 and X=halogen, (a) generating a non-thermal plasma by an AC voltage of frequency f, or operating a light arc, or introducing electromagnetic energy in the infrared region into the gas, giving a resulting phase which (b) is dispersed in a wetting agent and distilled, and then (c) the distillate is contacted at least once with a mixture of at least two of the substances hydrofluoric acid, nitric acid, water, giving a solid residue comprising hollow bodies having a silicon-comprising shell after the conversion reaction of the distillate with the mixture has abated or ended.

12 Claims, 3 Drawing Sheets

(51) Int. Cl.
*C01B 33/027* (2006.01)
*C01B 33/03* (2006.01)

(56) References Cited

U.S. PATENT DOCUMENTS

| | | |
|---|---|---|
| 2013/0015175 A1 | 1/2013 | Karl et al. |
| 2014/0199227 A1 | 7/2014 | Hoppe et al. |
| 2014/0341794 A1 | 11/2014 | Hoppe et al. |
| 2015/0147256 A1 | 5/2015 | Hoppe et al. |
| 2015/0218475 A1 | 8/2015 | Strese et al. |
| 2015/0236511 A1 | 8/2015 | Strese et al. |
| 2015/0298093 A1 | 10/2015 | Markowz et al. |
| 2015/0307354 A1 | 10/2015 | Hoppe |
| 2015/0315936 A1 | 11/2015 | Markowz et al. |

OTHER PUBLICATIONS

Anoop Gupta, et al. "Luminescent Colloidal Dispersion of Silicon Quantum Dots from Microwave Plasma Synthesis: Exploring the Photoluminescence Behavior Across the Visible Spectrum", XP-0015220273, Advanced Functional Materials, 2009, Bd. 19, Nr.5, pp. 696-703.

Dongyun Chen, et al., "Reversible Lithium-Ion Storage in Silver-Treated Nanoscale Hollow Porous Silicon Particles", XP-002740201, Angewandte Chemie International Edition, 2012, Bd.51, Nr.10, pp. 2409-2413.

Seongbeom Kim, et al., "Enhanced Performance of a Polymer Solar Cell upon Addition of Free-Standing, Freshly Etched, Photoluminescent Silicon Nanocrystals", XP-001574088,The Japan Society of Applied Physics, Applied Physics Express Br.5, Nr.2, 2012, 3 pages.

Folarin Erogbogbo, et al., "Biocompatible Luminescent Silicon Quantum Dots for Imaging of Cancer Cells", XP55074569, vol. 2, No. 5, 2008, pp. 873-878.

PROCESS FOR PRODUCING HOLLOW SILICON BODIES

BACKGROUND OF THE INVENTION

Field of the Invention

The invention relates to processes for producing hollow bodies having a silicon-comprising shell, by converting at least one silane in a light arc or in a plasma, preferably in a plasma which is operated in a non-thermal equilibrium, or converting or pyrolysing it by means of electromagnetic waves, then dispersing in a solvent and distilling, and then converting in an etching operation.

Discussion of the Background

Metallic and semi-metallic particles such as silicon, for example, are important functional materials. Because of their property of intercalating lithium ions, they play an important role in the production of battery electrodes, catalysts or solar cells. In the case of batteries, for example lithium ion batteries, cycling stability with simultaneous prevention or inhibition of the formation of what are called dendrites or whiskers is a critical requirement. Inadequate cycling stability reduces the usability of the energy storage means in the event of frequent, often incomplete, charging and discharging, and whiskers can even destroy the battery as a result of internal short circuits. It is therefore very important to prevent such processes and to make functional material available in a large volume and in the purity required for the stated applications.

The application DE 102006059318 A1 proposes a process for producing porous silicon particles which exhibit typical photoluminescence as known in the literature. For this purpose, a plasma is produced by means of microwaves in a mixture of monosilane and argon or hydrogen, and the reaction product is thermally aftertreated in a hot wall reactor. The result is nanoparticles having solid amorphous cores. The nanoparticles can join together to form aggregates or agglomerates. By first converting the nanoparticles, aggregates or agglomerates with a solution of hydrofluoric acid in water and then with nitric acid in water, porous silicon particles are obtained after the acid has been consumed and the reaction has abated. Silicon particles of this kind have open pores which can be utilized, for example, as channels for the transport of liquids.

If such silicon particles were used in a battery as electrode material or as separator, the open pores would be large enough to promote the formation of whiskers which enter into typical transport operations for lithium ion batteries in the electrolyte and on the electrode material. The whiskers penetrate the pores gradually and establish an electrical connection between the battery electrodes, equivalent to an internal short circuit. A battery equipped with such a material would be unusable after a few charging cycles.

SUMMARY OF THE INVENTION

The problem addressed by the present invention was therefore that of providing a process for producing an improved material and the material itself which is suitable for use in solar cells and/or energy storage.

The present invention relates to a process for producing hollow bodies having a silicon-comprising shell, said process comprising:

in a gas comprising at least one silane of the general formula $Si_nH_{2n+2-m}X_m$ with n=1 to 4, m=0 to 2n+2 and X=halogen, (a) generating a non-thermal plasma by an AC voltage of frequency f, or operating a light arc,
or introducing electromagnetic energy in the infrared region into the gas, giving a resulting phase which
(b) is dispersed in a wetting agent and distilled, and then
(c) the distillate is contacted at least once with a mixture of at least two of the substances hydrofluoric acid, nitric acid, water,
giving a solid residue comprising hollow bodies having a silicon-comprising shell after the conversion reaction of the distillate with the mixture has abated or ended.

In another embodiment, the present invention relates to a hollow body having a silicon-comprising shell, obtained the above process.

In addition, the present invention relates to a solar cell, comprising the above hollow body.

Moreover, the present invention provides an electrode material in an energy storage cell, comprising the above hollow body.

DETAILED DESCRIPTION OF THE INVENTION

Figure 1:
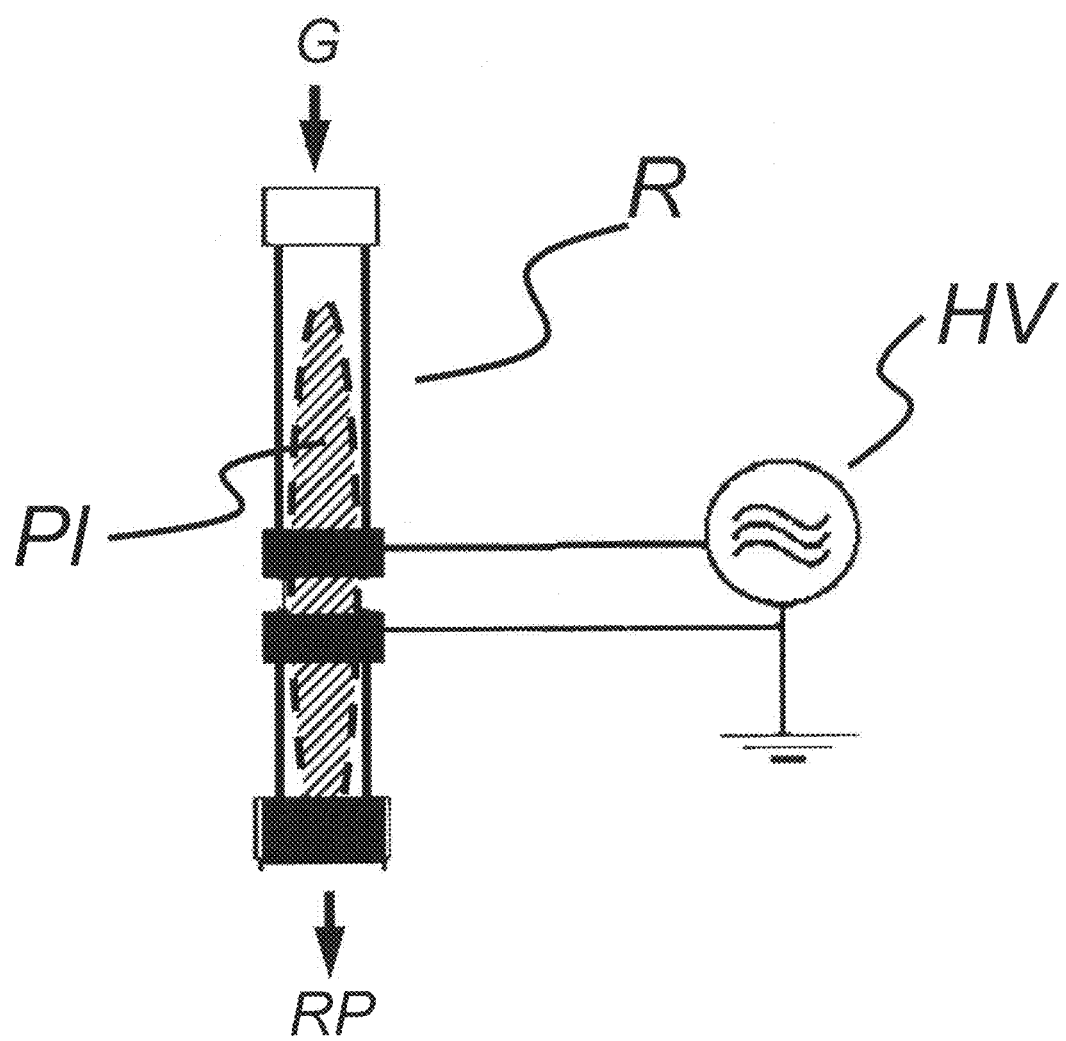
FIG. 1 shows a reactor (R) in schematic form.

Any ranges mentioned herein below include all values and subvalues between the upper and lower limits of the range.

It has been found that, surprisingly, in the case of conversion of a silane or halosilane in a non-thermal plasma, in a light arc, or generally in a pyrolysis, and subsequent dispersion of the resulting phase in a wetting agent, subsequent distillation and conversion of the distillate in a mixture of water, nitric acid and/or hydrofluoric acid, hollow bodies having a silicon-containing shell are obtained.

The invention therefore provides a process for producing hollow bodies having a silicon-comprising shell, wherein, in a gas including at least one silane of the general formula $Si_nH_{2n+2-m}X_m$ with n=1 to 4, m=0 to 2n+2 and X=halogen, (a) a non-thermal plasma is generated by means of an AC voltage of frequency f, or a light arc is operated, or electromagnetic energy, preferably in the infrared region, is introduced into this gas, giving a resulting phase which
(b) is dispersed in a wetting agent and distilled, and then
(c) the distillate is contacted at least once with a mixture of at least two of the substances hydrofluoric acid, nitric acid, water, giving a solid residue comprising hollow bodies having a silicon-comprising shell after the conversion reaction of the distillate with the mixture has abated or ended.

The invention is elucidated in detail hereinafter.

The hollow bodies obtained in accordance with the invention include silicon or compounds of silicon, preferably predominantly silicon, in their shells, meaning that at least 50% of the mass of the hollow bodies obtained by the process is silicon. The shells of the hollow bodies may be closed or open.

Preferably, in the general formula of the silane used, n=1 and/or 2, X=chlorine and m=0 to 6. Particular preference is given to using monosilane, TCS, STC or a mixture of these silanes. Very particular preference is given to using monosilane.

In step (a), it may be advantageous to use high-purity silane, meaning a boron content of about 1 ppt to 10 ppm and a phosphorus content of about 1 ppt to 10 ppm.

In addition, it may be advantageous, in step (a), to use microwaves or electromagnetic energy in the region of mid-infrared wavelengths, meaning 3 to 50 μm.

For a definition of non-thermal plasma and a gas discharge in non-thermal equilibrium, reference is made to the relevant technical literature, for example to "*Plasmatechnik: Grundlagen and Anwendungen—Eine Einführung*" [Plasma Technology: Fundamentals and Applications—An Introduction]; collective of authors, Carl Hanser Verlag, Munich/Vienna; 1984, ISBN 3446-13627-4.

The non-thermal plasma can be produced by a gas discharge in the at least one silane-containing gas stream. Preferably, the plasma is produced by means of transient high-voltage discharge in a bipolar electrode arrangement having a reference potential electrode and a high-voltage electrode. The electrodes may be functionalized or equipped with an electron exit auxiliary, for example BaO.

Paschen's law states that the ignition voltage for the plasma discharge is essentially a function of the product p·d, from the pressure of the gas, p, and the electrode distance, d. The electrode separation is also referred to as gas arc distance, abbreviated to GAP. For the planar electrode arrangement, which is preferred in the process, this product, which defines the ignition voltage, is preferably about 10 mm·bar. The discharge can be induced by means of various AC voltages and/or pulsed voltages from 1 to 1000 kV. The magnitude of the voltage depends, in a manner known to the person skilled in the art, not only on the gas arc distance of the discharge arrangement but also on the process gas itself. The voltage used with preference in the process may be pulsed and may preferably be about 10 kilovolts peak (10 $kV_p$) and have a half-height pulse duration rounded to 700 nanoseconds and a repetition rate of about 14 000 $s^{-1}$. The profile of this voltage against time may also be rectangular, trapezoidal, or composed of sections of individual profiles against time. Any combination of profile against time composed of these forms may be used.

The specific energy flux density which is introduced for generation and/or maintenance of the non-thermal plasma may be chosen in the range from 0.01 to 1000 W·s·cm². It is further preferable to conduct the specific energy input by means of exact-phase measurement of the instantaneous power with a bandwidth of at least 250 kHz. This measurement of instantaneous power may be effected in a coaxial reactor having discharge area 100 cm². A coaxial reactor is preferably a tubular reactor, especially a rotationally symmetric tubular reactor.

The energy input to form the non-thermal plasma is preferably effected in such a way that very substantially homogeneous conditions are established in the plasma which forms for the reaction of the silanes themselves, for example with nitrogen- and/or germanium-containing compounds. It is especially preferable here to operate the non-thermal plasma at a voltage at which the discharge covers the entire electrode area. This may be the case in the event of a glow discharge, as familiar to those skilled in the art.

The at least one silane-containing gas may be introduced by means of at least one nozzle. The gas used may be a mixture comprising at least one silane and at least one inert diluent gas. A preferred specific flow density of the gas with 10% monosilane in argon is around 40 cm·s⁻¹, the value obtained from a volume flow rate of 240 cm³·min⁻¹ per cm² of electrode area. The residence time during which the particles reside in the reaction space and are at least partly converted in the plasma is up to 10 000 ms, preferably within a range from 1 to 1000 ms. The conversion in the plasma leads to generation of chemical free radicals from which silicon-containing particles form in turn. These particles may, as well as silicon, likewise include SiN, SiO and/or SiC, depending on the composition of the gas.

The resulting phase includes these particles and is pulverulent. The particles may occur individually, specifically with diameters of the particles of 3 to 300 nm, preferably of 50 to 300 nm. The particles may likewise be aggregated in the form of clusters. The clusters may be formed by aggregation of individual crystalline particles in the course of production and may optionally continue to grow. Both the isolated particles and the clusters have at least one, preferably exactly one, crystalline phase of pure silicon. The clusters may be present in the form of linear chains, wires or the like, or else in branched form.

If the gas is kept at a temperature of 100 to 500° C., preferably at 500° C., during step (a) or at the end of step (a), the resulting phase comprises predominantly particles not agglomerated to clusters. If temperatures greater than 500° C. are chosen, preferably a temperature of 550° C. to 1300° C., predominantly particles agglomerated to clusters are obtained.

The clusters may have a size of 20 nm to 6 μm, preferably of 20 nm to 3 μm, further preferably of 400 nm to 6 μm, more preferably of 100 nm to 3 μm, even more preferably of 300 nm to 3 μm, 500 nm to 3 μm, 1 to 3 μm.

The resulting phase comprising the clusters and/or particles leaves the reaction space and/or may be deposited in the reaction space.

In the context of the invention, the reaction space is understood to mean the interior of the reactor. Within this volume, the plasma discharge, glow discharge or pyrolysis, or the glowing of the light arc, takes place, or the electromagnetic energy is introduced. FIG. 1 shows such a reactor (R) in schematic form and by way of example. According to the invention, the gas (G) is introduced into the reactor (R), and a plasma discharge (PI) is generated therein by means of a device for generating an AC voltage (HV). The resulting phase (RP) that leaves the reaction space is shown in schematic form. In order that the resulting phase is not deposited or does not remain entirely in the reaction space, it can be drawn out of the reactor by means of a vacuum pump. Possible uses of apparatuses for evacuation and suitable pressures or gas flows are known to those skilled in the art.

In step (a) of the process according to the invention, it is possible to use a plasma reactor, induction reactor, pyrolysis furnace or light arc furnace, and the reaction space of the reactor or furnace may preferably be manufactured from glass, oxide ceramic, carbide ceramic or graphite.

More preferably, it is possible to use metal-free ceramic, metal-free glass, or ceramic or glass, having high purities. Preference is given to using a reactor which may be constructed as a module from partial elements or manufactured in one piece. The energy input can preferably be effected by an electromagnetic route, for example by means of plasma electrodes.

The wetting agent which is used in step (b) may be selected from at least one alcohol, water, nitric acid, or a mixture of these substances. At least one alcohol and water are used with preference.

In step (b) of the process according to the invention, it may be advantageous first to degas the resulting phase and then to disperse in a wetting agent selected from water and ethanol.

For the degassing, it is possible to use a compression stage. Preferably, the phase can be dispersed in high-purity water or in a mixture of high-purity water and ethanol, and then distilled off. More preferably, the phase can be dispersed in ethanol and then distilled off. Preferably, an amount of 10 to 50 g of water, more preferably 15 to 25 g of water, is used per gram of distillate obtained at the end of step (b). Additionally preferably, 10 to 50 g of alcohol, more preferably 15 to 25 g of alcohol, may be used per gram of distillate obtained at the end of step (b). Most preferably, equal masses of water and alcohol, preferably ethanol, are used per gram of distillate obtained at the end of step (b).

In step (c) of the process according to the invention, the distillate is preferably contacted first with a mixture of water and nitric acid and then with hydrofluoric acid, giving a solid residue after the conversion reaction has abated, which is washed, filtered and/or dried.

Preferably, step (c) is conducted once, further preferably at least once. During at least one performance of step (c), preferably from 3 to 10 g, more preferably from 3 to 6 g, of nitric acid are used per gram of the distillate obtained at the end of step (b). The concentration of the nitric acid is preferably 70%. In addition, during at least one performance of step (c), preferably from 0 to 70 g of hydrofluoric acid HF is used per gram of the distillate obtained at the end of step (b), more preferably from 0 to 60 g of HF, even more preferably from 0 to 45 g of HF and most preferably from 0 to 10 g of HF. The concentration of the hydrofluoric acid may be chosen in the range from 4% to 12%, preferably from 5% to 10%.

If the conversion reaction comes to a stop during at least one performance of step (c) without any further action, this is referred to as "abating" in the context of the invention. The recognition of the abatement of the conversion reaction in step (c) is familiar to those skilled in the art. According to the invention, abatement occurs if the acid(s) has/have been fully converted and the distillate has not been fully converted. In this case, the solid residue comprising hollow bodies having a silicon-comprising shell is obtained in accordance with the invention.

In an alternative embodiment of the invention, the conversion reaction is stopped, terminated or greatly slowed during at least one performance of step (c) before the distillate is fully converted. This is referred to as "ending" in the context of the invention. In this case too, the solid residue comprising hollow bodies having a silicon-comprising shell is obtained in accordance with the invention.

Quite generally, the full conversion of the distillate should be avoided in any performance of step (c). The course of action required for this purpose is known to those skilled in the art. This is because the conversion reaction in step (c) is an etching reaction. If no further etching reaction is taking place and only a liquid is apparent to the eye, no solid residue is present. It is then necessary to produce a resulting phase again in accordance with the invention.

The presence of the solid residue can be established easily by the person skilled in the art, since the solid residue is visually well-differentiated from the liquid which is obtained on abatement or ending of the conversion reaction during step (c).

Preferably, in the case of performance of step (c), it is necessary to use such an amount of mixture with acid or acids that the distillate is not converted fully. Preferably, abatement of the conversion reaction is obtained by using from 3 to 5 g, more preferably 5 g, of nitric acid per gram of distillate during a performance of step (c).

It is likewise preferable to end the conversion reaction by diluting the mixture with water during at least one performance of step (c) and/or removing the distillate from the mixture prior to the abatement, for example by filtering it off in a manner known to those skilled in the art.

It is additionally preferable to select the ending of the conversion reaction by adding water, more preferably distilled or purified water, during step (c).

In the process according to the invention, the solid residue can be washed, filtered and/or dried, or the conversion reaction is preferably ended, preferably by adding water, in which case the solid residue is subsequently washed, filtered and/or dried. More preferably, it can be filtered through a membrane, preferably through a cellulose mixed ester membrane, and washed and dried at a temperature of 20° C. to 100° C., preferably at 60° C., most preferably under reduced pressure.

The time during which the conversion reaction is allowed to run may be up to 3.5 days in batchwise mode. Preferably, the conversion reaction is allowed to abate.

During at least one performance of step (c), the conversion reaction can be ended or abated without any further action. It may additionally be advantageous to conduct step (c) more than once. The abating and/or ending is preferably selected during a single performance, more preferably during the first and the second performance, of step (c).

Preferably, in the at least first repetition of step (c), after the reaction has abated or ended, water and nitric acid can be added again to the reaction product.

More preferably, small amounts of HF can be added repeatedly to the reaction product after the reaction has abated or ended, meaning repeated addition of HF in an amount of 5% to 50% in each case, based on the amount of nitric acid added.

The invention likewise provides hollow bodies having a silicon-comprising shell which are obtained by the process according to the invention.

The hollow bodies may have regular or irregular shapes. They may, for example, have a spherical shape, egg shape or irregular shape. The hollow bodies may be present as individual bodies. Individual bodies may also have aggregated to form clusters. The clusters can also be referred to as agglomerates, a cluster in the present case being understood to mean aggregated or fused bodies. For instance, the bodies can form clusters in which at least two bodies are fused to one another at their surfaces. These clusters may take the form of linear chains, be in the form of wires or else be in branched form, and have a size known to the person skilled in the art for the particles which are used as electrode material in batteries, for example in zinc-carbon, alkaline or lithium ion batteries. Preferably, these sizes are in the range from 20 nm to 6 μm.

Without being bound to a theory, the inventors suspect that the so-called Kirkendall effect could be a driving effect in the formation of the shell as opposed to the wholly or partly surrounded volume. This is because, during step (c), nitrogen compounds diffuse more quickly out of the particle interior than silicon compounds or silicon atoms or silicon ions into the interior of the particles being converted.

Preferably, the silicon-comprising shell of the hollow bodies according to the invention, or those obtained in accordance with the invention, has a thickness, determined by transmission electron microscopy, of 5 to 40 nm.

The invention likewise provides for the use of the hollow bodies according to the invention, or of those obtained in accordance with the invention, for production of solar cells or of electrode materials in energy storage cells.

Having generally described this invention, a further understanding can be obtained by reference to certain specific examples which are provided herein for purposes of illustration only, and are not intended to be limiting unless otherwise specified.

The invention is elucidated in detail hereinafter by examples.

Example 1

Electromagnetic energy with a power of about 100 W was introduced into a gas composed of monosilane (SiH$_4$), within a wavelength range known to those skilled in the art of about 500 nm to 4 µm, corresponding to a temperature of 1150° C.

The resulting phase which included 1.1 g of pulverulent silicon was dispersed in a wetting agent composed of 20 g of ethanol and distilled.

Figure 3:
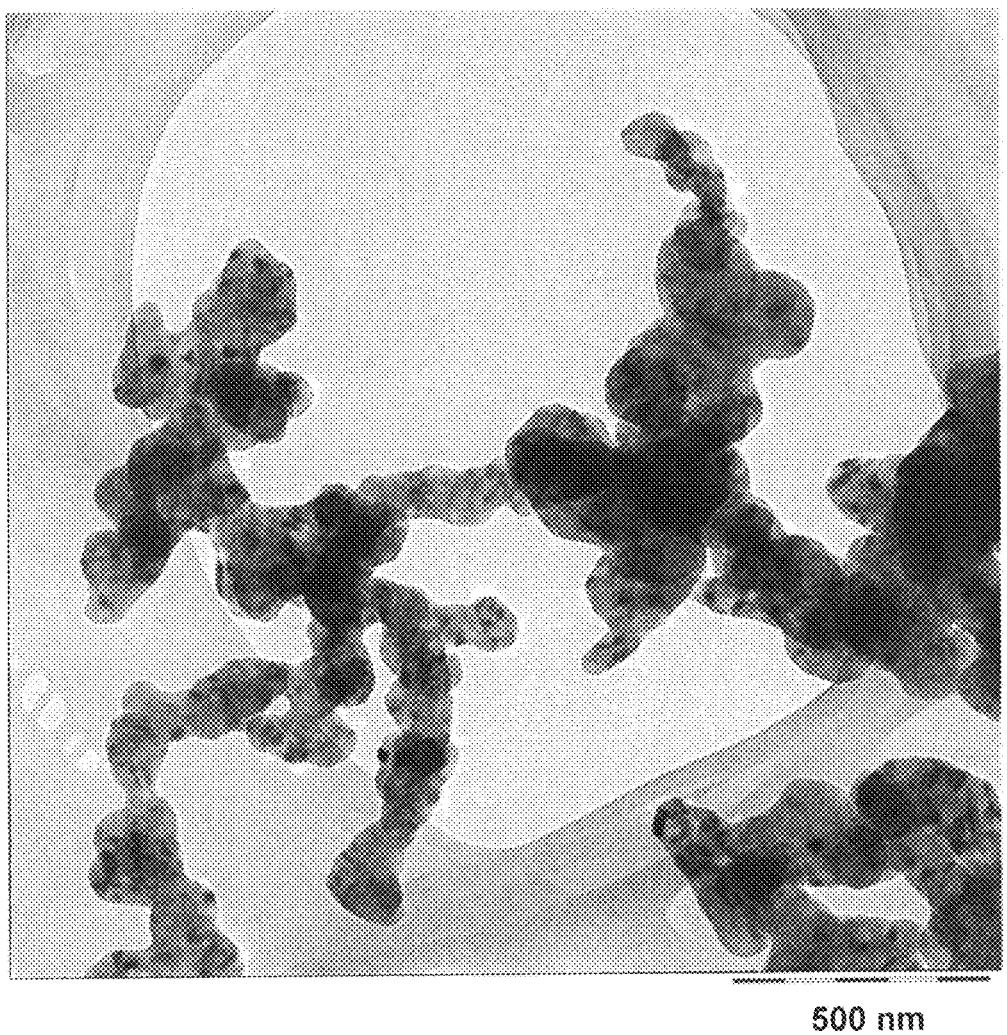
FIG. 3 shows a TEM image of a distillate obtained after step b) of the process of the present invention.

The distillate, shown in a transmission electron microscopy (TEM) image (FIG. 3), was subsequently admixed with a mixture of 20 g of H$_2$O and 5 g of 70 percent HNO$_3$. The expressions "70 percent HNO$_3$" and "HNO$_3$ (70%)" are equivalent in the context of the present invention and are familiar to the person skilled in the art as a mixture of HNO$_3$ and water in the corresponding proportions.

After 3.5 days had passed, the reaction had abated, and a light-coloured residue was present. 10 g of 5 percent hydrofluoric acid were added thereto. After the conversion reaction brought about thereby had abated, a solid residue was obtained, which was filtered off.

Figure 2:
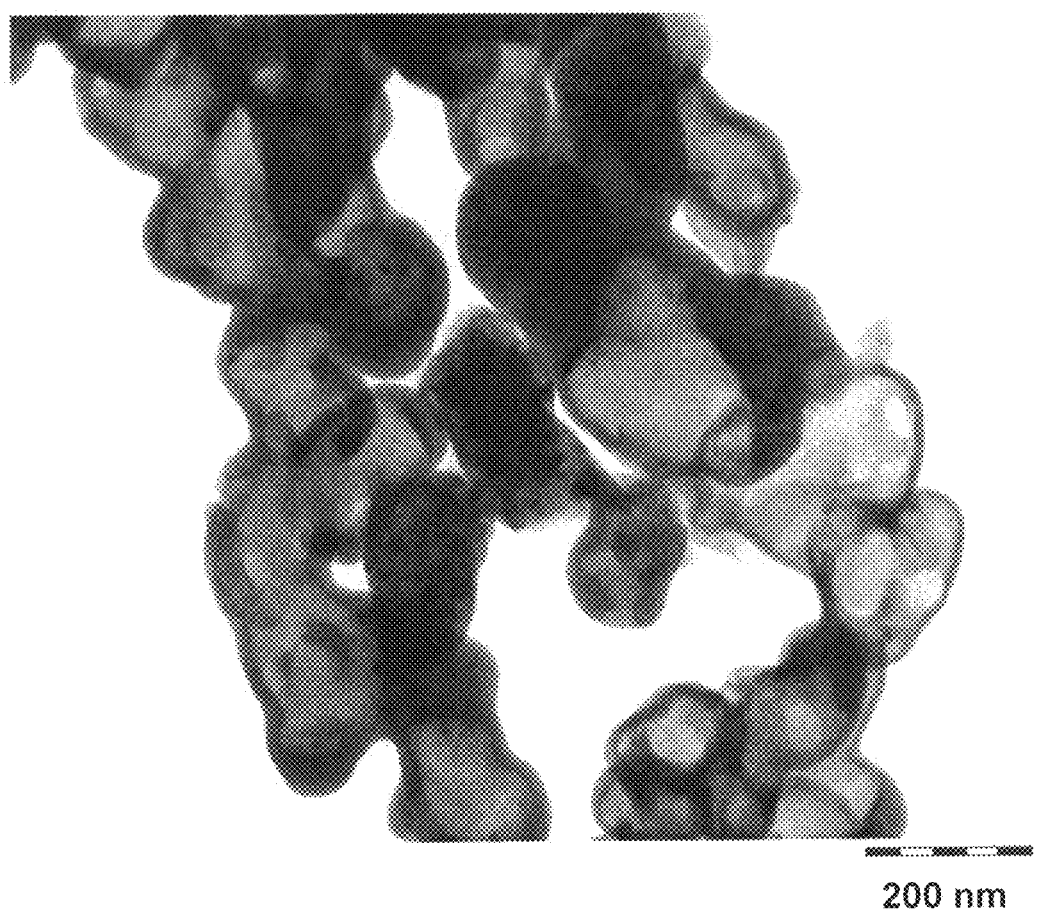
FIG. 2 shows a TEM image of the hollow bodies obtained in accordance with the invention.

In the TEM image, this solid residue showed the hollow bodies obtained in accordance with the invention (FIG. 2).

Example 2

As Example 1, but with the differences which follow.

After the distillate had been admixed with a mixture of 20 g of H$_2$O and 5 g of HNO$_3$ (70%) and the conversion reaction had been left to take place for 1.2 days, another mixture of 20 g of H$_2$O and 5 g of HNO$_3$ (70%) was added.

After the conversion reaction had abated, 40 g of 5 percent hydrofluoric acid were added. After the conversion reaction that then took place had abated, a solid residue was obtained, which was filtered off. The hollow bodies according to the invention were obtained.

Example 3

As Example 1, but with the differences which follow.

The resulting phase was dispersed in a mixture of 5 g of H$_2$O and 10 g of HNO$_3$ (70%) and distilled.

After the distillate had been admixed with 5 g of HNO$_3$ (70%) and then with 45 g of 10 percent hydrofluoric acid, the conversion reaction was left to take place for a period of 3 days.

After this period had elapsed, the conversion reaction was ended by the addition of 100 g of water.

After the ending, a solid residue was obtained, which was filtered off and which comprised the hollow bodies according to the invention.

Comparative Example 1

As Example 3, except that the conversion reaction was not ended after the addition of the 45 g of 10 percent hydrofluoric acid, but was left to abate.

No solid residue was obtained.

European patent application EP14195300 filed Nov. 28, 2014, is incorporated herein by reference.

Numerous modifications and variations on the present invention are possible in light of the above teachings. It is therefore to be understood that within the scope of the appended claims, the invention may be practiced otherwise than as specifically described herein.

The invention claimed is:

1. A process for producing a hollow body comprising a silicon-comprising shell, said process comprising:
   in a gas comprising a silane of formula Si$_n$H$_{2n+2-m}$X$_m$ with n=1 to 4, m=0 to 2n+2 and X=halogen,
   (a) producing a resultant phase by generating a non-thermal plasma by an AC voltage of frequency f, or operating a light arc, or introducing electromagnetic energy in an infrared region into the gas,
   (b) dispersing the resultant phase in a wetting agent and distilling the dispersed resultant phase, thereby forming a distillate,
   (c) carrying out a conversion reaction by contacting the distillate at least once with a mixture comprising at least two substances selected from the group consisting of hydrofluoric acid, nitric acid, and water, and
   (d) abating or ending the conversion reaction of the distillate with the mixture, thereby forming a solid residue comprising the hollow body having a silicon-comprising shell after the conversion reaction of the distillate with the mixture has abated or ended.

2. The process according to claim 1, wherein the producing is carried out in a plasma reactor, induction reactor, pyrolysis furnace or light arc furnace, and
   an interior which is a reaction space of the plasma reactor, induction reactor, pyrolysis furnace or light arc furnace comprises glass, oxide ceramic, carbide ceramic or graphite.

3. The process according to claim 1, further comprising degassing the resultant phase prior to the dispersing the resultant phase in the wetting agent,
   wherein the wetting agent is at least one selected from the group consisting of water and ethanol.

4. The process according to claim 1, wherein the carrying out the conversion reaction comprises first contacting the distillate with a mixture of water and nitric acid and then with hydrofluoric acid, giving said solid residue and
   the process further comprises, after the abating of the conversion reaction, washing, filtering and/or drying the solid residue.

5. The process according to claim 1, further comprising: washing, filtering and/or drying the solid residue.

6. The process according to claim 1, further comprising: washing, filtering and/or drying the solid residue after the ending the conversion reaction.

7. The process according to claim 1, wherein, in (a), the non-thermal plasma is generated by the AC voltage of frequency f.

8. The process according to claim 1, wherein, in (a), the light arc is operated.

9. The process according to claim 1, wherein, in (a), the electromagnetic energy in the infrared region is introduced into the gas.

10. The process according to claim 1, wherein the gas comprises monosilane.

11. The process according to claim 1, wherein the silane comprises a boron content of about 1 ppt to 10 ppm and a phosphorus content of about 1 ppt to 10 ppm.

12. The process according to claim 6, wherein the conversion reaction is ended by adding water.

\* \* \* \* \*